(12) United States Patent
Sakata et al.

(10) Patent No.: US 6,870,870 B2
(45) Date of Patent: Mar. 22, 2005

(54) SEMICONDUCTOR LASER DEVICE AND PROCESS FOR PRODUCING THE SAME

(75) Inventors: Masahiko Sakata, Kyoto (JP); Atsuo Tsunoda, Kashiba (JP)

(73) Assignee: Sharp Kabushiki Kaisha, Osaka (JP)

( * ) Notice: Subject to any disclaimer, the term of this patent is extended or adjusted under 35 U.S.C. 154(b) by 111 days.

(21) Appl. No.: 10/166,032

(22) Filed: Jun. 11, 2002

(65) Prior Publication Data

US 2002/0187577 A1 Dec. 12, 2002

(30) Foreign Application Priority Data

| Jun. 11, 2001 | (JP) | ........................................ | 2001-175452 |
| Jun. 10, 2002 | (JP) | ........................................ | 2002-169102 |

(51) Int. Cl.⁷ ................................................ H01S 5/00
(52) U.S. Cl. ............................................................ 372/46
(58) Field of Search ..................................... 372/43–50

(56) References Cited

U.S. PATENT DOCUMENTS 5,888,844 A 3/1999 Bestwick et al. ............. 438/46
5,970,080 A 10/1999 Hata ............................ 372/45

FOREIGN PATENT DOCUMENTS

| JP | 2-207583 | 8/1990 | |
| JP | 5029281 | 2/1993 | |
| JP | 6-268317 | 9/1994 | |
| JP | 9-298343 | 11/1997 | |
| JP | 9-331117 | 12/1997 | |
| JP | 10-163560 | 6/1998 | |
| JP | 11-26885 | * 1/1999 | ............. H01S/3/18 |

* cited by examiner

*Primary Examiner*—Quyen Leung
(74) *Attorney, Agent, or Firm*—Morrison & Foerster LLP

(57) ABSTRACT

The present invention relates to a ridge-stripe semiconductor laser device and a process for producing the same. More specifically, the object of the present invention is to control the formation of cavities at the side of the ridge without adding any step, and to provide a ridge stripe semiconductor laser device with good properties by strictly controlling its ridge width and a process for producing the same. Thereby, it is possible to form a ridge whose sidewalls stand almost vertically.

1 Claim, 12 Drawing Sheets

SEMICONDUCTOR LASER DEVICE AND PROCESS FOR PRODUCING THE SAME

FIELD OF THE INVENTION

The present invention relates to a ridge-stripe semiconductor laser device and a process for producing the same.

BACKGROUND OF THE INVENTION

An example of a structure of a conventional ridge-stripe semiconductor laser device is shown in FIG. 9. Here, a GaAS/AlGaAs ridge-stripe semiconductor laser device is explained as a representative example.

In this semiconductor laser device, on a n-GaAS substrate 101, a n-AlGaAs cladding layer 103, a quantum-well structure active layer 104, a p-AlGaAs cladding layer 105, a p-AlGaAs semiconductor layer 107, a p-GaAs cap layer 109 and a p-GaAs contact layer 111 are formed in order. The p-AlGaAs semiconducotor layer 107 and the p-GaAs cap layer 109 are shaped into a ridge, and a high-resistive or n-type current blocking layer 110 is formed on both sides of the ridge.

In addition, on the p-AlGaAs cladding layer 105 is formed an etching-stopper layer 106 comprising GaAs.

A process flow of forming a conventional ridge is shown in FIG. 10. In this figure, the n-GaAS substrate 101, the n-AlGaAs cladding layer 103 and the quantum-well structure active layer 104 are not shown.

First, a common photoresist film is formed on a surface of a wafer on which the formation of the p-GaAs cap layer 109 has been finished, and an etching mask 113 is formed against etching for forming a ridge pattern using a general photolithography technique (FIG. 10a).

Next, the wafer is etched to the middle of the p-AlGaAs semiconductor layer 107 using a sulfuric acid/hydroperoxide etchant (FIG. 10b) and, subsequently, the wafer is etched to the etch-stopper layer 106 with hydrofuloric acid. Since hydrofuloric acid dissolves AlGaAs but GaAs, when the remaining p-AlGaAs semiconductor layer 107 is etched with hydrofuloric acid, etching will stop at the etch-stopper layer 106.

Further, etching is continued to adjust a width of a lower part of the ridge to a predetermined width (FIG. 10c).

After that, the photoresist film, i.e., the etching mask 113 is peeled by an organic solvent to complete the formation of the ridge stripe (FIG. 10d).

On the wafer on which ridge formation had been done in this way, a current blocking layer 110 was formed by using the MOVPE process (FIG. 10e).

Then, a photolithography was performed using a photoresist film in order to remove an unnecessary part 110a of the current blocking layer 110 growing on the ridge stripe which is a current constriction part, and the surface of wafer other than the unnecessary part 110a was covered with an etching mask 114 (FIG. 10f).

After that, wet-etching was carried out to remove the unnecessary part 110a on the ridge stripe (FIG. 10g) and, subsequently, the etching mask 114 was removed with an organic solvent (FIG. 10h).

After washing the wafer surface, a p-GaAs contact layer 111 was formed by using the MOVPE process again to complete the ridge stripe semiconductor laser wafer (FIG. 10i).

However, when ridge stripes are shaped only by wet-etching as described above, the following problems occur.

In the case of wet-etching, since etching proceeds isotropically, in order to obtain a predetermined width, it is required that a ridge pattern width of the etching mask 9 is set to a width wider than the predetermined edge width with considering an amount of side etching.

In addition, due to the side etching, the ridge height is limited and it is difficult to control the shape of the ridge strictly. Although lower ridge is convenient because production is easier, when the ridge is too low, a light diffused from the active layer is absorbed by the p-GaAs cap layer, resulting in deterioration in laser device properties, such as increase in a threshold current, reduction in a differential efficiency and the like. Therefore, the ridge height should be 1.5 $\mu$m or larger and, furthermore, in a high-output laser in which the diffusion of the light from the active layer is large, formation of a higher ridge is desired.

Further, since the p-AlGaAs semiconductor layer 107 is etched with hydrofuloric acid, only the sidewalls of the p-AlGaAs semiconductor layer 107 is selectively etched without etching the GaAs cap layer 109. Consequently, side etching of the p-AlGaAs semiconductor layer 107 proceeds around the interface between the p-GaAs cap layer 109 and the p-AlGaAs semiconductor layer 107.

As a result, since the width of the p-GaAs cap layer 109 becomes wider than a predetermined ridge width by setting the width of the ridge pattern of the etching mask to a width wider than the predetermined ridge width, and since the width of the p-AlGaAs semiconductor layer 107 just under the p-GaAs cap layer 109 becomes narrower than the predetermined ridge width due to side etching, overhanging parts are formed at an upper part of the ridge, and the ridge stripe has a shape like a mushroom with a wide cap.

When a n-current blocking layer 110 is grown on a wafer having such a ridge shape by an epitaxial growth technique, such as a metal organic vapor phase epitaxial (MOVPE) process, an epitaxial growth does not completely proceed just under the overhanging parts of the p-GaAs cap layer 109, resulting in the formation of cavities 112 (FIG. 10e). These cavities never disappear in the following steps (FIGS. 10f~i) and remains in the completed laser device.

The existence of such cavities and fluctuation in the ridge width lead to reduction in differential efficiency of the laser device properties, increase in a threshold/working current, occurrence of kink and the like to deteriorate laser device properties.

In JP-A 6-268317 discloses a process for suppressing the formation of cavities under a dielectric mask (SiO$_2$) for wet-etching in a step of shaping striped ridges by removing the dielectric mask after shaping a ridge by wet-etching to make its width narrower than a predetermined width of the ridge stripe. However, although this process is useful for suppressing the formation of cavities at the side of the ridge, this requires etching treatment for adjusting the size of the dielectric mask and, accuracy of the etching control is not high.

An example of a structure of a conventional high-output ridge-stripe semiconductor laser device is shown in FIG. 11. Here, a GaAS/GAInP/AlGaAs ridge-stripe semiconductor laser device is explained as a representative example.

In this semiconductor laser device, on a n-GaAS substrate 101, a n-GaInP intermediate layer 102, a n-AlGaAs cladding layer 103, a quantum-well structure active layer 104, a p-AlGaInP cladding layer 105, a p-AlGaAs semiconductor layer 107, a p-GaInP intermediate layer 108, a p-GaAs cap layer 109 and a p-GaAs contact layer 111 are formed in order. The p-AlGaInP semiconductor layer 107, the p-GaInP intermediate layer 108 and the p-GaAs cap layer 109 are shaped into a ridge, and a high-resistive or n-type current blocking layer 110 is formed on both sides of the ridge. This current blocking layer 110 is formed with AlInP for high-output use.

In addition, on the p-AlGaInP cladding layer 105 is formed an etching-stopper layer 106 comprising GaAs.

A process flow of forming a conventional ridge is shown in FIG. 12. In this figure, the n-GaAS substrate 101, the n-GaInP intermediate layer 102, the n-AlGaInP cladding layer 103 and the quantum-well structure active layer 104 are not shown.

First, an aluminium oxide ($Al_2O_3$) film is formed on a surface of a wafer on which the formation of the p-GaAs cap layer 109 has been finished by a molecular beam epitaxial (MBE) process, and an $Al_2O_3$ etching mask 113 is formed against etching for forming a ridge pattern using a general photolithography technique and by wet-etching (FIG. 12a).

Next, the p-GaAs cap layer 109 is etched using a sulfuric acid/hydroperoxide etchant and, subsequently, the p-AlGaInP semiconductor layer 107 is etched halfway using a bromine/phosphoric acid etchant and, lastly, the remaining semiconductor layer 107 is etched to the etch-stopper layer 106 with a hot phosphoric acid etchant to complete the formation of the ridge stripe (FIG. 12c).

On a wafer on which ridge formation had been done in this way, a current blocking layer 110 was formed by using the MBE process (FIG. 12d).

Then, a photolithography was performed using a photoresist film in order to remove an unnecessary part 110a of the current blocking layer 110 growing on the ridge stripe which is current constriction part, and the surface of wafer other than the unnecessary part 110a was covered with an etching mask 114 (FIG. 12e).

After that, wet-etching was carried out to remove the unnecessary part 110a on the ridge strip (FIG. 12f) and, subsequently, the etching mask 114 was removed by UV ozone ashing (FIG. 12g).

After washing the wafer surface, a p-GaAs contact layer 111 was formed by using the MBE process again to complete the ridge stripe semiconductor laser wafer (FIG. 12h).

However, when ridge stripes are shaped only by wet-etching gas described above, the following problems occur, and it is difficult to make a high-output laser device.

In a real-guide structure device used for a high-output laser light, it is required to make the ridge height higher and to make the ridge width narrower. Conventionally, ridge stripes have been shaped only by wet-etching. However, since, in the conventional method, a generally vertical ridge is not obtained and its shape becomes a trapezoid shape, it is very difficult to make a ridge with the above mentioned shape.

In addition, since for high-output use, the composition of the n-current blocking layer is changed from GaAs to AlInP, which has higher etch rate against phosphoric acid, the current blocking layer 110 growing on the ridge is etched with a hot phosphoric acid etchant (FIG. 12f), leading to insufficient formation of the current blocking layer. As a result, the obtained laser device does not properly function.

SUMMARY OF THE INVENTION

Thus, in consideration of the above problems, the object of the present invention is to control the formation of cavities at the side of the ridge without adding any step, and to provide a ridge stripe semiconductor laser device with good properties by strictly controlling its ridge width and a process for producing the same.

DETAILED DESCRIPTION OF THE INVENTION

Figure 1:
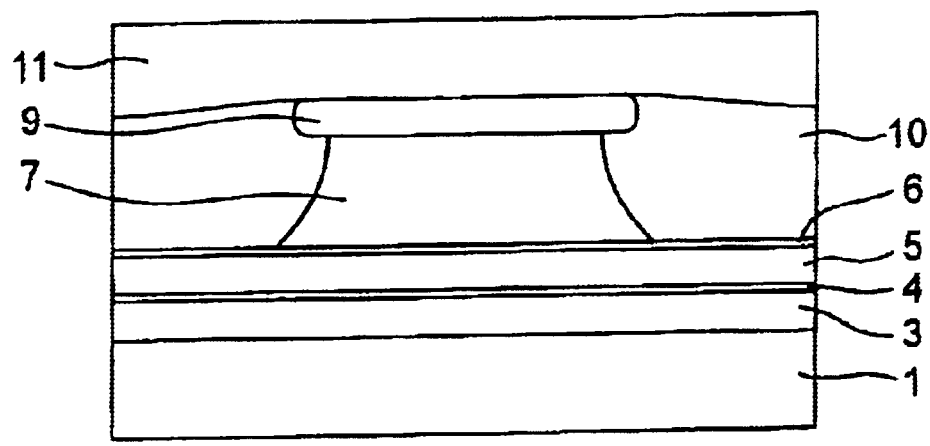
FIG. 1 shows a cross-sectional view of a structure of the ridge-stripe semiconductor laser device of the first embodiment according to the present invention.

Conventionally, ridge etching is carried out only by wet-etching. The present inventors have found that in the case of etching a wafer on which a light-emitting multilayer, a p-AlGaAs semiconductor layer and a p-GaAs cap layer have been formed on a n-GaAs substrate, when dry-etching is carried out prior to wet-etching, anisotropicity of wet-etching is enhanced, and, consequently, a side-etching amount of the semiconductor layer becomes large, and that, thus, it is possible to vary the side-etching amount significantly. Therefore, the inventors have accomplished a process for producing a ridge stripe semiconductor laser device with improved device properties by using both dry-etching and wet-etching.

In the first embodiment of the present invention, since both dry-etching and wet-etching are used to shorten the period of wet-etching, the side etching amount of the ridge part of the p-AlGaAs semiconductor layer can be reduced. Thereby, it is possible to form a ridge whose sidewalls stand almost vertically. Furthermore, as a result, it is possible to control the formation of cavities near the ridge sidewalls to vanish cavities or to optimize the size of cavities.

In the second embodiment of the present invention, an In-containing layer is used as an etch-stopper layer. Since the etching rate for the In-containing layer is extremely small, an effect of the etch-stopper layer can be greatly enhanced in dry-etching. That is, according to the process for producing a ridge stripe semiconductor laser device of the present invention, it become possible to shape a ridge only by dry-etching, and use of wet-etching is made redundant. As a result, a ridge which stands almost vertically and whose width is controlled strictly can be formed.

In the third embodiment of the present invention, when a high-output semiconductor laser device is formed, overhanging parts with an appropriate length are formed on both sides of the upper part of the ridge by adjusting the side etch amount of the ridge sidewalls of the semiconductor layer using both dry-etching and wet-etching. Since overhanging parts with an appropriate length are formed on the both sides of the upper part of the ridge, a cavity is formed besides the upper part of the ridge when the ridge is buried in the current blocking layer, wherein the cavity reaches to the sidewall of the ridge at one end and opens toward the surface of the current blocking layer.

As mentioned above, generally, the existence of such cavities deteriorates laser device properties. However, in the third embodiment of the present invention, a cavity which opens toward the surface of the current blocking layer is purposely formed. Thereby, when an etching mask against etching the unnecessary part of the current blocking layer growing on the ridge, photoresist flows into the cavity to form a photoresist film reaching the sidewall of the ridge so that over etching the current blocking layer adjoining the ridge sidewall may be prevented when removing the unnecessary part of the current blocking layer with a hot phosphoric acid etchant and the like. Thus, the current blocking layer may be formed sufficiently to produce a high-output ridge stripe semiconductor laser device.

Since high-output semiconductor laser device is produced by making a wafer with changing the direction of crystal growth, the etching selectivity between the cap layer and the semiconductor layer becomes small so that side etching hardly proceeds in ridge etching. Therefore, according to the conventional process for producing a high output semiconductor laser device using only wet-etching, overhanging part with a sufficient length for making a cavity opening toward the surface of the current blocking layer.

Consequently, according to the conventional process, since a photoresist film is not formed on the current blocking layer which completely covers an area other than the above-mentioned unnecessary part, the current blocking layer is over etched besides the ridge sidewall.

The terms "a first conductive-type cladding layer" and "a second conductive-type cladding layer" each other differently mean herein a n-cladding layer or a p-cladding layer.

The term "ridge height" means herein the total thickness of the semiconductor layer shaped into a ridge, the intermediate layer and the cap layer which are formed above the semiconductor layer. For example, in the semiconductor of the present invention, the ridge height means the height of the uppermost of the cap layer 9 from the etch-stopper layer 6.

Figure 7:
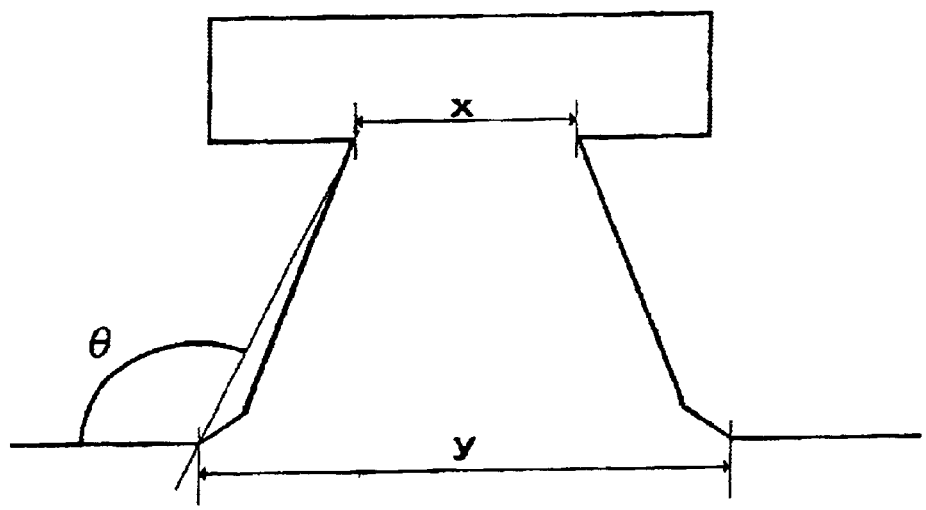
FIG. 7 shows a schematic illustration explaining the geometry of the ridge shape in the ridge stripe semiconductor laser device.

The term "overhanging part" means herein a projecting peripheral area of the intermediate layer and/or cap layer formed on the semiconductor layer as shown in an enlarged cross-sectional view of the ridge in FIG. 7. The term the "length" of the overhanging part means the distance from the edge of the intermediate layer or the cap layer to the edge of the semiconductor layer contacting with the intermediate layer or cap layer.

The term an "angle between the sidewall of the ridge and the surface of the active layer" means herein the angle θ made by a line connecting a point of the edge of the semiconductor layer contacting with the etch-stopper layer and a point of the edge of the semiconductor layer contacting with the intermediate layer or cap layer and the surface of the etch-stopper layer, as shown in an enlarged cross-sectional view of the ridge in FIG. 7.

In the ridge stripe semiconductor laser device of the present invention, it is preferred that the angle between the sidewall of the ridge and the surface of the active layer is 90±20°, more preferably 90±2°. When the angle between the sidewall of the ridge and the surface of the active layer is within the above angle range, it is said that the ridge sidewall stands almost vertically, or the ridge shape is generally vertical.

A preferred geometry of the ridge of the ridge stripe semiconductor laser device of the present invention comprises a width x of 0.5 μm for the upper part of the ridge, and width y of 1.8–2.9 μm for the lower part of the ridge, as shown in FIG. 7. It is preferred that the width for the upper part of the ridge is 0.5 μm or more because the ridge does not fall down and the resistance of the device does not become higher. There is especially no upper limit for the width x, but it is preferred that the width x does not make the width of the lower part of the ridge to exceed 2.9 μm when the angle 74 is 90±20°.

It is preferred that the width y is 1.8 μm or more because the width of the ridge on the side of the intermediate layer or cap layer becomes very narrow in additional etching for adjusting the ridge width and, therefor the ridge does not fall down and the resistance of the device does not become higher. It is preferred that the width y is 2.9 μm or less because the horizontal mode of the laser device properties are stable and no kink occurs.

EXAMPLE

A ridge stripe semiconductor laser device of the present invention and the process for producing the same are explained in detail using the following Examples, but these Examples do not intended to limit in any way the present invention, and they simply illuminate the present invention for well understanding the present invention. Therefore, changes and modifications made by using constitutions, compositions and semiconductor producing techniques well known to a person skilled in the art should be within the scope of the present invention.

Example 1

Figure 2:
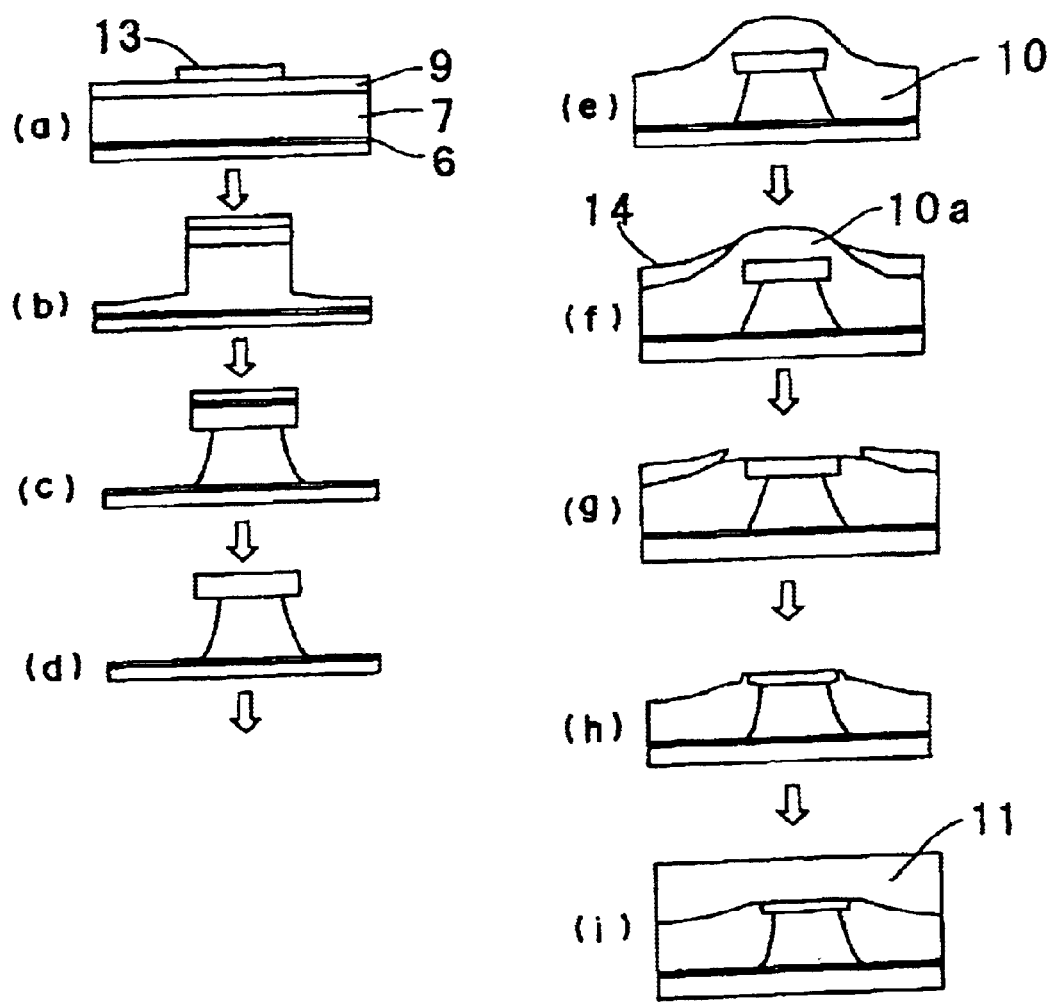
FIG. 2 shows a schematic illustration showing steps for producing the ridge tripe type semiconductor laser device of the first embodiment according to the present invention.

A structure of the laser device in the first embodiment of the present invention and a process flow thereof are explained based on FIGS. 1 and 2, respectively.

On a n-GaAS substrate 1, a n-AlGaAs cladding layer 3, a quantum-well structure active layer 4, a p-AlGaAs cladding layer 5, a p-AlGaAs semiconductor layer 7 and a p-GaAs cap layer 9 were epitaxially grown in order via a MOVPE process to make a wafer. (In the wafer of FIG. 2, the n-GaAs substrate 1, the n-AlGaAs cladding layer 3 and the quantum-well structure active layer 4 are not shown.) The p-AlGaAs cladding layer 3, the quantum-well structure active layer 4 and the p-AlGaAs cladding layer 5 constitute the light-emitting multilayer.

Further, a GaAs etch-stopper layer 6 to stop etching was formed on the p-cladding layer 5. Since when the etch-stopper layer absorbs light, device properties are deteriorated, the thickness of the etch-stopper layer 6 was adjusted so as to obtain a quantum effect which eliminates light-absorption.

Next, a positive photoresist were applied on the surface of the p-GaAs cap layer 9 via a spin-coating process to form a photoresist film having a thickness of about 5,000 Å~1 μm. Then, the photoresist film was exposed via a common photolithography technique using a photomask for making stripes having a width equivalent to the final ridge width or wider than the ridge width by about 0.5 μm, and was developed to form a ridge stripe pattern, which was then baked. After that, post-baking was carried out for 10~20 minutes at 90~110° C. to form an etching mask 13 against etching for forming ridge stripes (FIG. 2a).

Subsequently, the p-GaAs cap layer 9 and p-AlGaAs semiconductor layer 7 were dry-etched to a level above 500~3,500 Å from the etch-stopper layer 6 under the p-AlGaAs semiconductor layer 7 (FIG. 2b).

A dry-etching process includes, for example, a dry-etching process using Inductively Coupled Plasma (ICP) or Electron Cyclotron Resonance (ECR) plasma. This Example utilized the dry-etching process using ICP.

As etching gas, silicon tetrachloride ($SiCl_4$) alone or a mixed gas of $SiCl_4$ and helium or argon may be used. The etching gas pressure is preferably in the range of 0.16~1.3 Pa, and the most suitable value is about 0.2 Pa.

Additionally, a chlorine gas or a boron trichloride gas may be used in place of silicon tetrachloride.

A suitable bias voltage for applying to a wafer setting stage was investigated so as to obtain a normal ridge shape in the dry-etching process using ICP. The bias voltage is defined by two high-frequency powers, one is applied to an ICP coil and the other applied to the wafer setting stage.

First, since when the wafer temperature exceeds 100° C., it is possible that the etching mask of a photoresist film is deformed or burn out, the high-frequency power applied to the ICP coil for generating ICP was adjusted to 100~120 W so that the wafer temperature did not elevate above 100° C. in etching.

Figure 8:
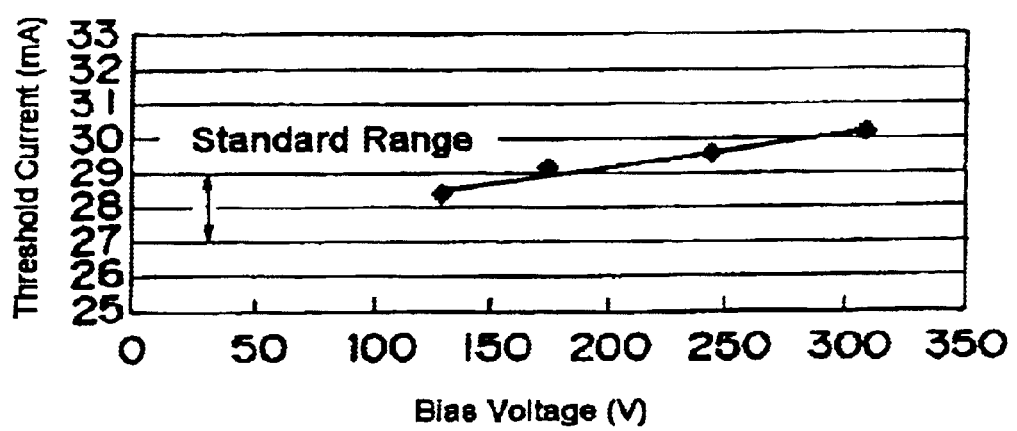
FIG. 8 shows a graphical representation indicating the relationship between a bias voltage and a threshold current in etching using inductively coupled plasma.
Figure 9:
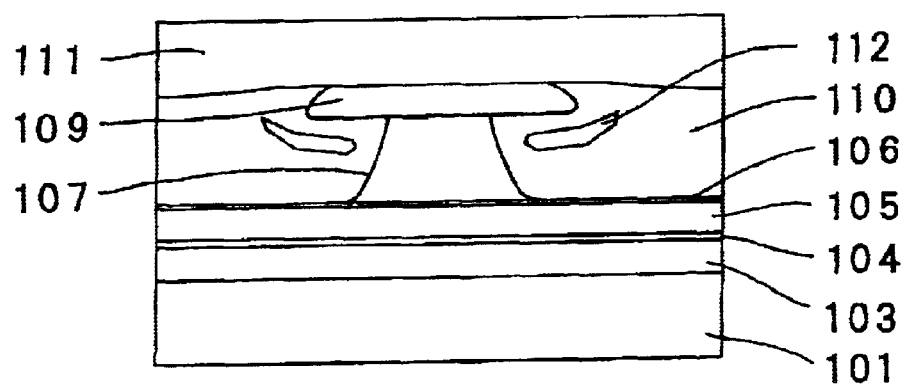
FIG. 9 shows a cross-sectional view of a structure of a conventional ridge-stripe semiconductor laser device.
Figure 10:
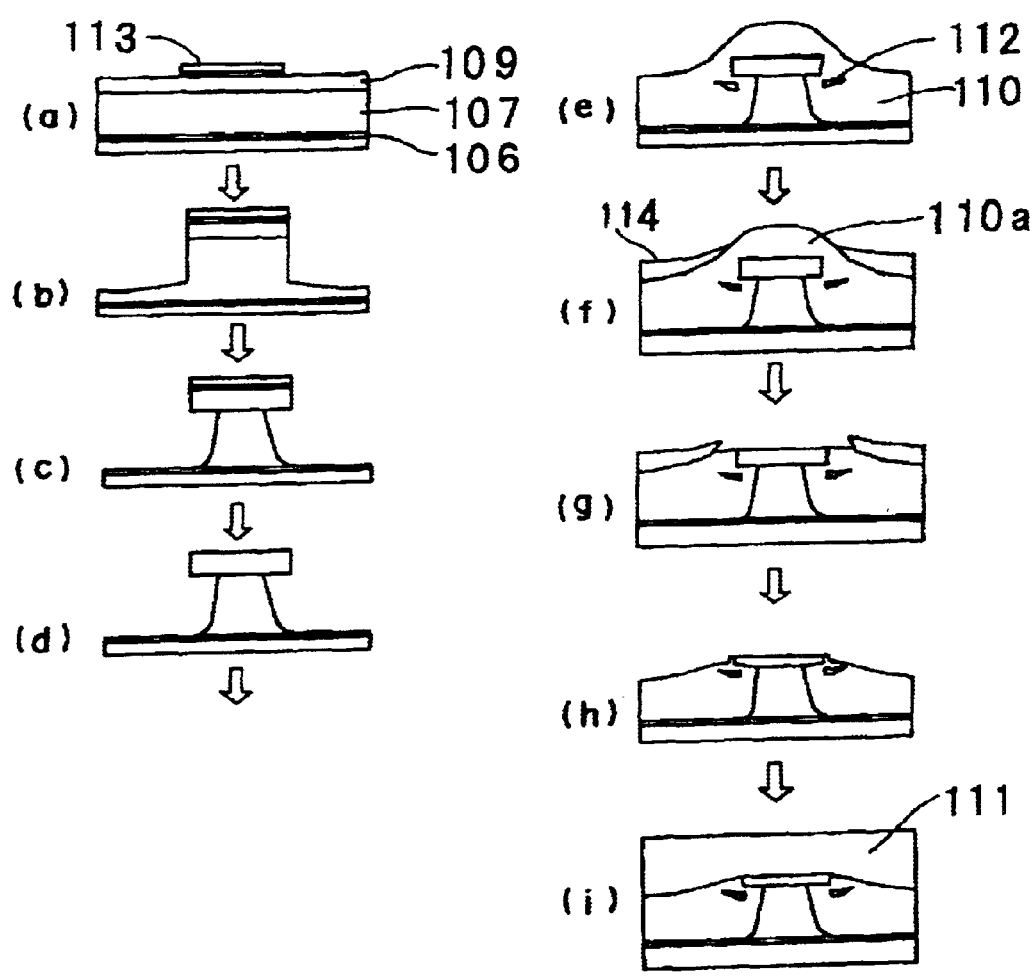
FIG. 10 shows a schematic illustration showing steps for producing the conventional ridge tripe type semiconductor laser device.
Figure 11:
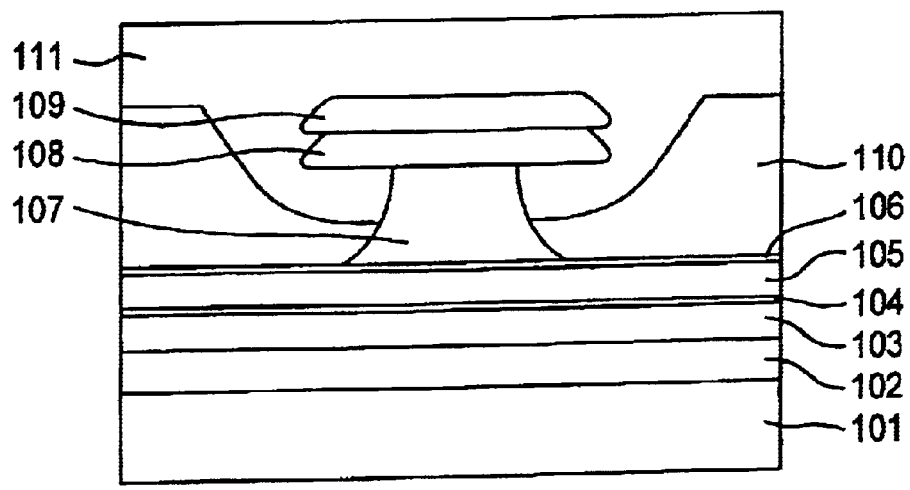
FIG. 11 shows an example of a structure of a conventional high-output ridge-stripe semiconductor laser device.
Figure 12:
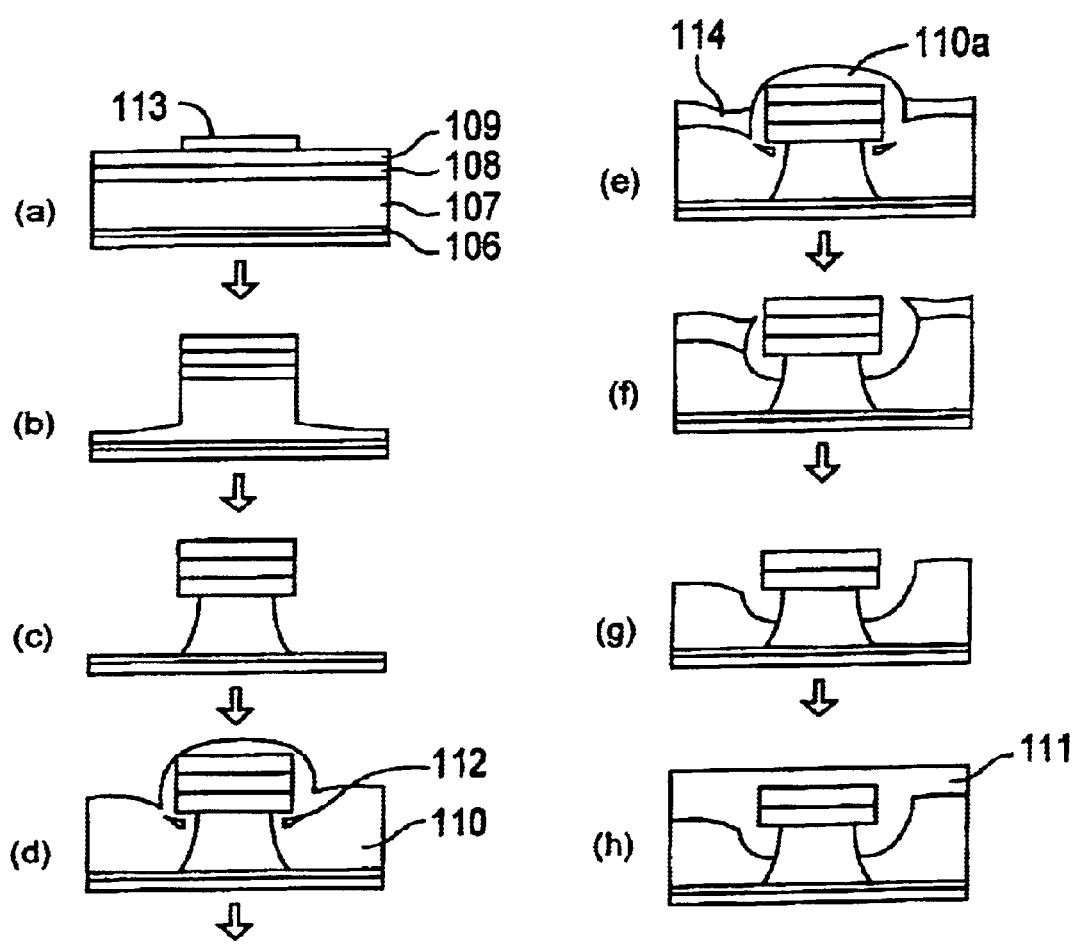
FIG. 12 shows a process flow of forming a conventional ridge.

FIG. 8 shows a relationship between the bias voltage to the wafer setting stage and a threshold current for a semiconductor laser device thus obtained. It is obviously indicated in FIG. 8 that as the bias voltage increases, the threshold current for the laser device increases due to damages in dry-etching, and that when the bias voltage is above 170 V, the threshold current exceeds a range for the standard threshold current, i.e., 27~29 mA.

Therefore, the high-frequency power applied to the ICP coil was adjusted to 100~120 W, and the high-frequency power applied to the wafer setting stage was varied so that the bias voltage became 50~170 V (0.15~0.55 V/cm²) to make laser devices. In this time, the high-frequency power applied to the wafer setting stage was 5~15 W. As a result, it is recognized that since when a bias voltage was below 110 V (~0.3 V/cm²), the etching rate became extremely small, such a bias voltage was not practical.

From the above, it becomes obvious that in dry-etching by using ICP, the best range for the high-frequency power applied to the ICP coil is 100~120 W, and the best range for the bias voltage to the wafer setting stage is 110~170 V (0.3~0.55 V/cm²).

As etching proceeds on a wafer surface with irradiating a laser light on the wafer surface, the intensity of the light reflecting from the surface varies. The variation of the intensity has waveform characteristics. Since an amplitude and a wave number of the waveform have relationships with an etching depth, the etching depth can be calculated by measuring the wave number.

Thus, the endpoint of etching was detected by irradiating a laser light on a wafer surface, and by monitoring the variation of the reflection rate due to the proceeding of etching.

Subsequently, the wafer after dry-etching was etched to the etch-stopper layer 6 with hydrofluoric acid cooled at around 10° C. Since the etch-stopper layer 6, whose thickness was adjusted to obtain a quantum effect eliminating a light-absorption, had durability against hydrofluoric acid, etching along a vertical direction to the wafer surface stopped when this layer appeared. After that, ridge etching was completed by adjusting an etching time so as to obtain a predetermined ridge width (FIG. 2c).

Subsequently, the unnecessary etching mask 13 was peeled by using an organic solvent or by ozone ashing (FIG. 2d).

Since the p-GaAs cap layer 7 also had durability against hydrofluoric acid, the etching mask 13 may be peeled prior to etching with hydrofluoric acid and, then, an additional ridge etching may be carried out by wet-etching.

On the wafer on which ridge formation had been done in this way, a current blocking layer 10 was formed by using the MOVPE process (FIG. 2e).

Then, a photolithography using a photoresist film was performed in order to remove an unnecessary part 10a of the current blocking layer 10 growing on the ridge stripe which is a current constriction part, and the surface of the wafer other than the unnecessary part 10a was covered with an etching mask 14 (FIG. 2f).

After that, wet-etching was carried out to remove the unnecessary part 10a on the ridge stripe (FIG. 2g) and, subsequently the etching mask 14 was removed with an organic solvent (FIG. 2h).

After washing the wafer surface, a p-GaAs contact layer 11 was formed by using the MOVPE process again to complete the ridge stripe semiconductor laser wafer (FIG. 2i).

In the ridge thus formed, the angle between the sidewall of the ridge and the surface of the active layer was 90±20°.

The length of the overhanging parts at the upper part of the ridge was limited to 0.8 μm or less. If the length of the overhanging parts is 0.8 μm or less, when the n-current blocking layer is grown, cavities are not formed or, if formed, they are very small. Therefore, laser device properties were not deteriorated.

This reduction of overhanging parts allows prevention or minimization of cavities formed at both sides of the ridge in a subsequent step of growing a current blocking layer via a MOVPE process.

On the other hand, in the conventional process, since the length of the overhanging parts of the ridge is generally 2.0 μm or more, cavities are formed just under the overhanging parts when the n-current blocking layer is formed.

In the present invention, since a significant part of the p-AlGaAs semiconductor layer 7 was etched by dry-etching which proceeds anisotropically, in place of wet-etching which proceeds isotropically, a time for wet-etching, in which a strict etching control is difficult, can be greatly reduced. Thereby, accuracy for controlling the ridge width improves, and ridges having a uniform shape can be formed. These effects lead to improvement in laser device properties and increase in a yield.

Although a photoresist film was used as an etching mask in the above explanation, an insulation layer such as $SiO_2$ having a thickness of 1,000 Å or larger. In this case, the mask was also removed simultaneously with hydrofluoric acid in wet-etching used together.

Example 2

Figure 3:
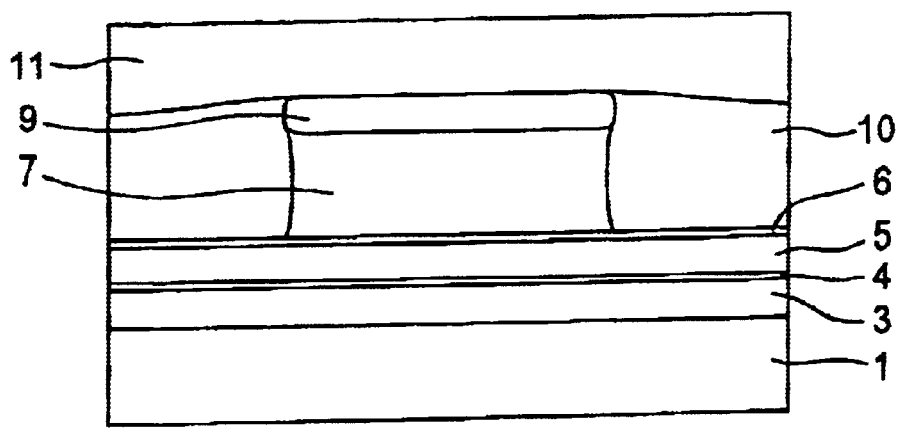
FIG. 3 shows a cross-sectional view of a structure of the ridge-stripe semiconductor laser device of the second embodiment according to the present invention.
Figure 4:
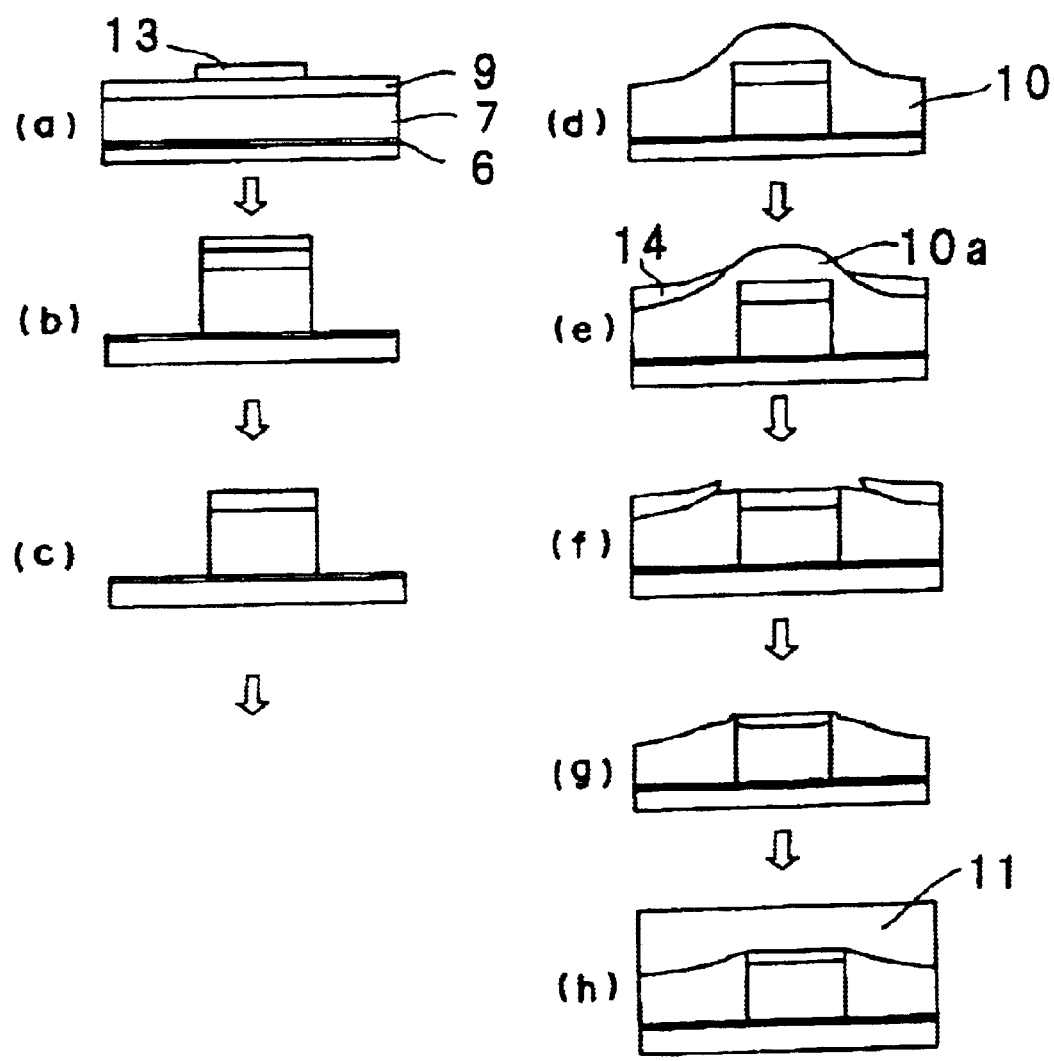
FIG. 4 shows a schematic illustration showing steps for producing the ridge tripe type semiconductor laser device of the second embodiment according to the present invention.

A structure of the laser device in the second embodiment of the present invention and a process flow thereof are explained based on FIGS. 3 and 4, respectively.

In the ridge stripe semiconductor laser device in the second embodiment of the present invention, an etch-stopper layer 6 was formed with an In-containing layer which has a band gap, or has a thickness designed to obtain a quantum efficiency, so that the layer 6 does not absorb a laser light, for example, GaInP or AlGaInP (FIG. 3).

Similarly to Example 1, a wafer on which the formation of the p-GaAs cap layer 9 has been finished on a n-GaAS substrate 1 (In the wafer of FIG. 4, the n-GaAs substrate 1, the n-AlGaAs cladding layer 3 and the quantum-well structure active layer 4 are not shown.)

Then, an etching resist mask 13 against etching for forming ridge stripes was formed on the surface of the p-GaAs cap layer 13 (FIG. 4a). After that, the wafer was dry-etched under the condition used in Example 1.

In the second embodiment of the present invention, since an In-containing layer was applied to the etch-stopper layer 6, its etching rate was much smaller than those for p-AlGaAs semiconductor layer 7 and p-GaAs cap layer 9, etching almost stopped at this In-containing layer. As a result, ridge etching could be completed only by dry-etching, and a ridge without overhanging parts was obtained, wherein the angle between the sidewall of the ridge and the surface of the active layer was 90±2° (FIG. 4c).

That is, more strictly controlling the formation of the ridge can be achieved relative to the case where both wet-etching and dry-etching are used.

On the wafer on which ridge formation had been done in this way, a current blocking layer 10 was formed by using the MOVPE process (FIG. 4d).

Then, a photolithography using a photoresist film was performed in order to remove an unnecessary part 10a of the current blocking layer 10 growing on the ridge stripe which is a current constriction part, and the surface of the wafer other than the unnecessary part 10a was covered with an etching mask 14 (FIG. 4e).

After that, wet-etching was carried out to remove the unnecessary part 10a on the ridge stripe (FIG. 4f) and, subsequently the etching mask 14 was removed with an organic solvent (FIG. 4g).

After washing the wafer surface, a p-GaAs contact layer 11 was formed by using the MOVPE process again to complete the ridge stripe semiconductor laser wafer (FIG. 4h).

Although a ridge-stripe semiconductor laser device having a GaAS/AlGaAS double heterostructure is mentioned in the above explanation, the present invention can be adapted, in part, to a semiconductor laser device using other materials.

Example 3

Figure 5:
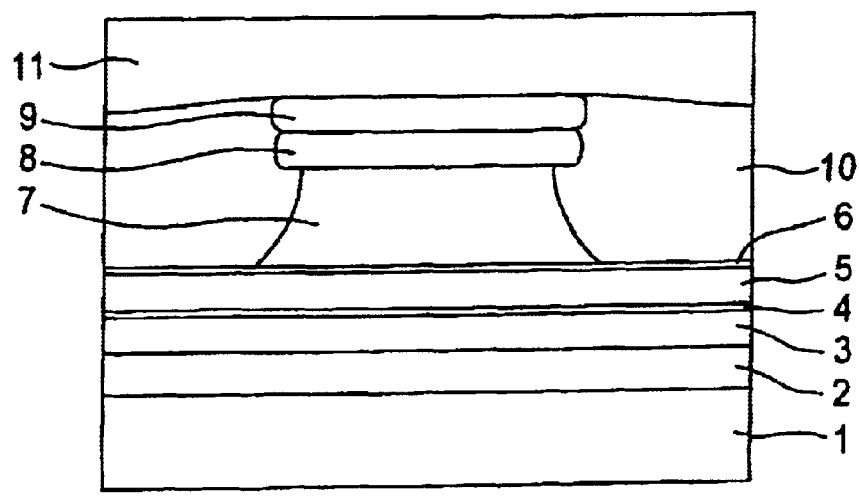
FIG. 5 shows a cross-sectional view of a structure of the ridge-stripe semiconductor laser device of the third embodiment according to the present invention.
Figure 6:
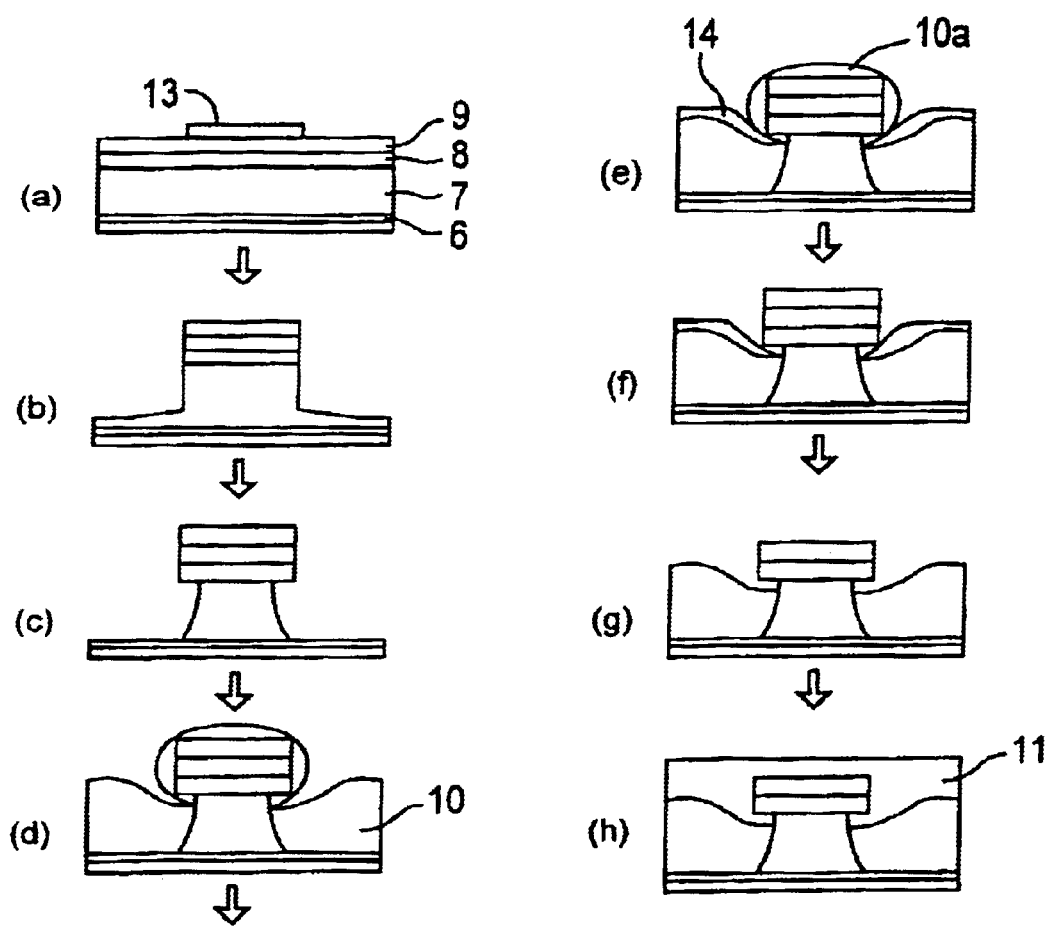
FIG. 6 shows a schematic illustration showing steps for producing the ridge tripe type semiconductor laser device of the third embodiment according to the present invention.

A structure of the laser device in the third embodiment of the present invention and a process flow thereof are explained based on FIGS. 5 and 6, respectively.

On a n-GaAS substrate 1, a n-GaInP intermediate layer 2, a n-AlGaInP cladding layer 3, a quantum-well structure active layer 4, a p-AlGaInP cladding layer 5, a p-AlGaInP semiconductor layer 7, a p-GaInP intermediate layer 8 and a p-GaAs cap layer 9 were epitaxially grown in order via a molecular beam epitaxial (MBE) process to make a wafer. (In the wafer of FIG. 6, the n-GaAs substrate 1, the n-GaInP intermediate layer 2, the n-AlGaInP cladding layer 3 and the quantum-well structure active layer 4 are not shown.) The p-AlGaInP cladding layer 3, the quantum-well structure active layer 4 and the p-AlGaInP cladding layer 5 constitute the light-emitting multilayer.

Further, a GaAs etch-stopper layer 6 to stop etching was formed on the p-cladding layer 5. Since when the etch-stopper layer absorbs light, device properties are deteriorated, the thickness of the etch-stopper layer 6 was adjusted so as to obtain a quantum effect which eliminates light-absorption.

An insulating film such as aluminium oxide ($Al_2O_3$) was formed on the p-GaAs cap layer 9 and, subsequently, a photoresist mask was formed on the $Al_2O_3$ film via a common photolithography technique and wet-etching. Then, an $Al_2O_3$ etching mask 13 against etching for forming ridge stripes was formed by wet-etching. After that, the photoresist mask was removed via UV ozone ashing (FIG. 6a).

In this case, the thickness of the etching mask 13 is determined by the selection ratio between the wafer and the etching mask 13 in dry-etching. For example, when the height of the ridge is about 2 $\mu$m, the thickness of the etching mask 13 should be 150 nm or more.

Subsequently, the p-GaAs cap layer 9, the p-AlGaInP intermediate layer 8 and p-AlGaInP semiconductor layer 7 were dry-etched to a level above 500~3,500 Å from the etch-stopper layer 6 under the p-AlGaInP semiconductor layer 7 (FIG. 6b).

A dry-etching process includes, for example, a dry-etching process using Inductively Coupled Plasma (ICP) or Electron Cyclotron Resonance (ECR) plasma. This Example utilized the dry-etching process using ICP.

As etching gas, silicon tetrachloride ($SiCl_4$) alone or a mixed gas of $SiCl_4$ and helium (He) or argon (Ar) may be used. In this Example, a mixture gas of $SiCl_4$, Ar and He with a mixing ratio of $SiCl_4$:Ar:He=3:3:5 was used as an etching gas. However, other mixture gas having other mixing ratio may also be used to carry out dry-etching.

The etching gas pressure is preferably in the range of 0.15~0.3 Pa, and the most suitable value is about 0.2 Pa.

A suitable bias voltage for applying to a wafer setting stage was investigated so as to obtain a normal ridge shape in the dry-etching process using ICP. The bias voltage is defined by two high-frequency powers, one is applied to an ICP coil and the other applied to the wafer setting stage.

In this Example, since a semiconductor layer comprising In is used for high-output use, the etching rate of the semiconductor layer is low. Therefore, it is preferred that the etching temperature is 200° C. or more, where In atom reacted with Cl in the etching gas begins to leave form a crystal.

Then, the high-frequency power applied to the ICP coil for generating ICP was adjusted to over 600 W so that the wafer temperature elevated above 200° C. in etching. In addition, it is desired that the etching temperature does not exceed 300° C. for protecting the seal of the dry-etching apparatus.

Next, in order to obtain a smooth etched surface and a generally vertical ridge shape, the high-frequency power of 100 W was applied so that the bias voltage to the wafer setting stage became 265~300 V (0.84~0.95 V/cm$^2$).

As etching proceeds on a wafer surface with irradiating a laser light on the wafer surface, the intensity of the light reflecting from the surface varies. The variation of the intensity has waveform characteristics. Since an amplitude and a wave number of the waveform have relationships with an etching depth, the etching depth can be calculated by measuring the wave number.

Thus, the endpoint of etching was detected by irradiating a laser light on a wafer surface, and by monitoring the variation of the reflection rate due to the proceeding of etching.

After that, the wafer after dry-etching was etched with a bromine/phosphoric acid etchant maintained at around 20° C. for 40~60 seconds. The wafer was then washed and dried, and, consequently, the wafer was etched to the etch-stopper layer 6 with phosphoric acid at 70° C. Since the GaInP etch-stopper layer 6 has a significantly low etching rate against hot phosphoric acid, etching along a vertical direction to the wafer surface stopped when this layer appeared. After that, ridge etching was completed by adjusting an etching time so as to obtain a predetermined ridge width (FIG. 6c). However, it is desired that the etching period with hot phosphoric acid is within 60 seconds because the ridge width varies from the predetermined range of the ridge width by etching too long.

Overhanging parts with a length of 0.13~1.0 μm were formed besides the upper part of the ridge.

In the present invention, since a significant part of the p-AlGaInP semiconductor layer 7 was etched by dry-etching which proceeds anisotropically, in place of wet-etching which proceeds isotropically, a time for wet-etching, in which a strict etching control is difficult, can be greatly reduced. Thereby, a ridge can be formed higher and narrower than a ridge obtained by the conventional process.

These effects lead to improvement in laser device properties and increase in a yield.

On the wafer on which ridge formation had been done in this way, a current blocking layer 10 was formed by using the MOVPE process. Since the overhanging parts having a length of 0.13~1.0 μm were formed besides the upper part of the ridge, cavities which reached the sidewall of the ridge and opened toward the surface of the current blocking layer 10 occurred just under the overhanging parts and besides the upper part of the ridge (FIG. 6d).

Then, a resist film was formed on the surface of the current blocking layer 10 by applying a resist via a spin-coating process. UV ashing was carried out to form an etching mask 14 which covered the surface of the wafer other than the unnecessary part 10a of the current blocking layer 10 growing on the ridge stripe in order to remove the unnecessary part 10a (FIG. 6e).

After that, wet-etching was carried out to remove the unnecessary part 10a on the ridge stripe (FIG. 6f) and, subsequently the etching masks 13 and 14 were removed (FIG. 6g).

After washing the wafer surface, a p-GaAs contact layer 11 was epitaxially grown by using the MBE process again to complete the ridge stripe semiconductor laser wafer (FIG. 6h).

Although a ridge-stripe semiconductor laser device having a GaAS/GaInP/AlGaInP double heterostructure is mentioned in the above explanation, the present invention can be adapted, in part, to a semiconductor laser device using other materials.

INDUSTRIAL APPLICABILITY

According to the present invention, in a ridge type semiconductor laser device, improvements in device properties can be achieved, such as increase in a differential efficiency, uniformization of a horizontal beam emission angle, kink-free and the like. In addition, a yield increases because a ridge shape is uniformized within a surface of a wafer and between wafers.

What we claimed are:

1. An AlGaInP ridge-stripe semiconductor laser device, comprising:

a light-emitting multilayer comprising a first conductive-type cladding layer, a second conductive-type cladding layer and an active layer disposed between the first and second cladding layers;

an etch-stopper layer formed on the second conductive-type cladding layer; and a semiconductor layer formed on the etch-stopper layer, wherein the semiconductor layer is shaped into a striped ridge, and an overhanging part is formed on a side of an upper part of the ridge, the ridge is buried in a current blocking layer, and the overhanging part has a length within the range from about 0.13 to about 1.0 μm.

* * * * *

UNITED STATES PATENT AND TRADEMARK OFFICE
CERTIFICATE OF CORRECTION

PATENT NO. : 6,870,870 B2
APPLICATION NO. : 10/166032
DATED : March 22, 2005
INVENTOR(S) : Sakata et al.

It is certified that error appears in the above-identified patent and that said Letters Patent is hereby corrected as shown below:

Title page, item (*) Notice: Subject to any disclaimer, the term of this patent is extended or adjusted under 35 U.S.C. 154(b)by 111 days.

Delete the phrase "by 111 days" and insert -- by 144 days --.

Signed and Sealed this

Thirty-first Day of August, 2010

David J. Kappos
*Director of the United States Patent and Trademark Office*